United States Patent [19]

Coffee et al.

[11] Patent Number: 4,729,739

[45] Date of Patent: Mar. 8, 1988

[54] CONNECTOR FOR A CHIP CARRIER UNIT

[75] Inventors: James A. Coffee, Bellingham; Thomas S. Spinelli, Attleboro; Harold M. Yevak, Jr., Shrewsbury; Debra J. Provazza, Seekonk; Peter A. Foley, Dighton, all of Mass.

[73] Assignee: Texas Instruments Incorporated, Dallas, Tex.

[21] Appl. No.: 907,953

[22] Filed: Sep. 15, 1986

[51] Int. Cl.[4] .............................................. H01R 23/72
[52] U.S. Cl. ..................................... 439/71; 439/862; 439/936
[58] Field of Search ............. 339/17 CF, 174, 75 MP, 339/176 M, 176 MP; 174/52 FP; 439/70–73, 525, 862, 936

[56] References Cited

U.S. PATENT DOCUMENTS

| 3,474,387 | 10/1969 | Krum et al. | 339/75 |
| 3,671,917 | 6/1972 | Ammon et al. | 339/17 L |
| 3,740,699 | 6/1973 | Johnson et al. | 339/176 MP |
| 4,037,270 | 7/1977 | Ahmann et al. | 339/17 CF |
| 4,366,345 | 12/1982 | Jaigle | 174/52 PE |

FOREIGN PATENT DOCUMENTS

| 1147643 | 4/1963 | Fed. Rep. of Germany | 339/176 MP |
| 2537512 | 2/1977 | Fed. Rep. of Germany | 339/176 MP |

OTHER PUBLICATIONS

Electronics, Film Carrier Technique, p. 89, 5-1974.

Primary Examiner—Neil Abrams
Attorney, Agent, or Firm—James P. McAndrews; John A. Haug; Melvin Sharp

[57] ABSTRACT

A connector for mounting and electrically connecting a chip carrier unit in an electrical circuit has a plurality of electrical contacts secured in openings in the bottom of an electrically insulating body to permit cantilever spring deflection of the contacts in accommodating a chip carrier unit within the connector between the contacts. The contacts comprise wire members of round cross section each having an opposite end bent to be slidable along a narrow line of engagement with an inclined ramp surface on an adjacent side wall of the connector body. Each contact has a bowed portion intermediate the contact ends which is bowed away from the adjacent ramp surface to slidably engage terminals on the chip carrier unit as the unit is inserted into the connector. Engagement with the chip carrier terminals permits selected flattening of the bowed portions of the contacts and sliding of the opposite contact ends on the adjacent side wall ramp surfaces to provide simple beam spring deflection of the contacts in combination with the cantilever spring deflection, thereby to provide a force for resiliently engaging the chip carrier terminals.

5 Claims, 2 Drawing Figures

CONNECTOR FOR A CHIP CARRIER UNIT

BACKGROUND OF THE INVENTION

The field of this invention is that of sockets or connectors for integrated circuit units, and the invention relates more particularly to a connector for mounting and electrically connecting plastic leaded chip carrier units having large numbers of unit leads or terminals in electrical circuits on printed circuit boards.

Plastic, leaded, chip carrier units are typically square or rectangular and have a large number of short, stiffly resilient terminals or leads of J configuration or the like spaced along the four sides of the unit. Each unit is typically mounted in a connector having an electrically insulating body with a bottom and side walls which has a plurality of electrical contacts disposed in openings in the bottom of the body spaced around a common axis. Ends of the connector contacts extend from the body with a selected spacing to be connected to circuit paths in an electrical circuit on a printed circuit board. The connector contacts resiliently engage the terminals or leads on the chip carrier unit as the unit is inserted into the connector body along the common axis for electrically connecting the terminals to the connector contacts. In some conventional devices, contact engagement with the chip carrier terminals detachably retains the unit in the connector while in other known connectors separate latch means are used for retaining the chip carrier in the connector.

With such conventional chip carrier connectors, it is found that when the connector contacts are proportioned to provide each contact with sufficient stiffness to engage its intended mating terminal on the chip carrier unit with a desired minimum contact engaging force, excessive force may sometimes be required for inserting the chip carrier into the connector or for withdrawing the chip carrier from the connector. As a result, permanent deformation of connector contacts may sometimes occur, or the chip carrier unit may be damaged during the insertion or withdrawal. Similarly, the connector contacts may not undergo sufficient deflection during insertion of the chip carrier unit to assure that each contact is properly engaged with its intended chip carrier terminal.

BRIEF SUMMARY OF THE INVENTION

It is an object of this invention to provide a novel and improved connector for mounting and electrically connecting a chip carrier unit in an electrical circuit; to provide such a connector having contacts which engage chip carrier terminals with more uniform and positively predetermined contact engaging forces; to provide such a connector having contacts which are freely movable to assure engagement of all of the contacts with intended chip carrier terminals; to provide such a connector which is characterized by improved chip carrier unit insertion and withdrawal forces; to provide such a connector of high reliability and low cost which is rugged, simple and easily assembled construction; and to provide such a connector which is adapted for mounting chip carrier units having large numbers of terminals with high unit density on printed circuit boards.

Briefly described, the novel and improved connector of this invention comprises an electrically insulating body having a bottom, side walls upstanding from the bottom, and a plurality of openings in the bottom spaced around a common axis. A plurality of resilient electrically conductive metal contacts are disposed in the body openings to resiliently engage terminals on opposite sides of a chip carrier unit which is inserted into the connector along the common axis. The connector contacts extend from the connector body to be connected in an electrical circuit on a printed circuit board.

In accordance with this invention, the contacts provide combined cantilever/simple beam spring action for engaging chip carrier terminals in an improved manner. That is, the connector body preferably has ramp surfaces on the side walls which face the common axis but which are inclined relative to that axis to face away from the bottom of the body near the distal edges of the body side walls. The contacts preferably comprise wire members of substantially round cross section and each have one end secured in a body opening to permit cantilever spring deflection of the contacts for accommodating the chip carrier unit between the contacts and for assuring that each connector contact is easily moved into resilient electrical engagement with its intended terminal on the chip carrier unit.

Each contact also has its opposite end slidable on an adjacent side wall ramp surface and has a bowed portion intermediate the contact ends which is bowed away from the adjacent side wall surface. The bowed contact configuration permits selected flattening of the bowed contact portion and sliding of the opposite contact end on the adjacent side wall ramp surface when the contact is engaged by a chip carrier terminal for providing simple beam spring deflection of the contact bowed portion in addition to the noted cantilever spring action, thereby to provide a desired contact engaging force relative to the chip carrier terminal. Preferably the contacts are proportioned relative to the inclination of the adjacent side wall ramp surface to require substantially greater force per unit deflection for the simple beam spring deflection of the contact than for the cantilever spring deflection of the contact to achieve improved accommodation of the chip carrier unit between the contacts while also providing more uniform and precisely predetermined contact engaging forces. Preferably the wire contact members have orientation portions fitted into orientation slots in the connector body for orienting the bowed portions of the contact with a selected disposition in the connector body. Preferably also the connector body openings mount the connector contacts to extend from the connector to be accommodated with a selected spacing between the contacts on a printed circuit board while also being adapted to engage chip carrier unit terminals with half said selected spacing. Preferably the contact bowed portions cooperate with spacers on the connector body for detachably retaining the chip carrier unit in the connector while permitting easy withdrawal of the unit from the connector when desired.

DESCRIPTION OF THE DRAWINGS

Other objects, advantages and details of the novel and improved connector of this invention appear in the following detail description of preferred embodiments of the invention, the detialed description referring to the drawings in which.

DESCRIPTION OF PREFERRED EMBODIMENTS

Figure 1:
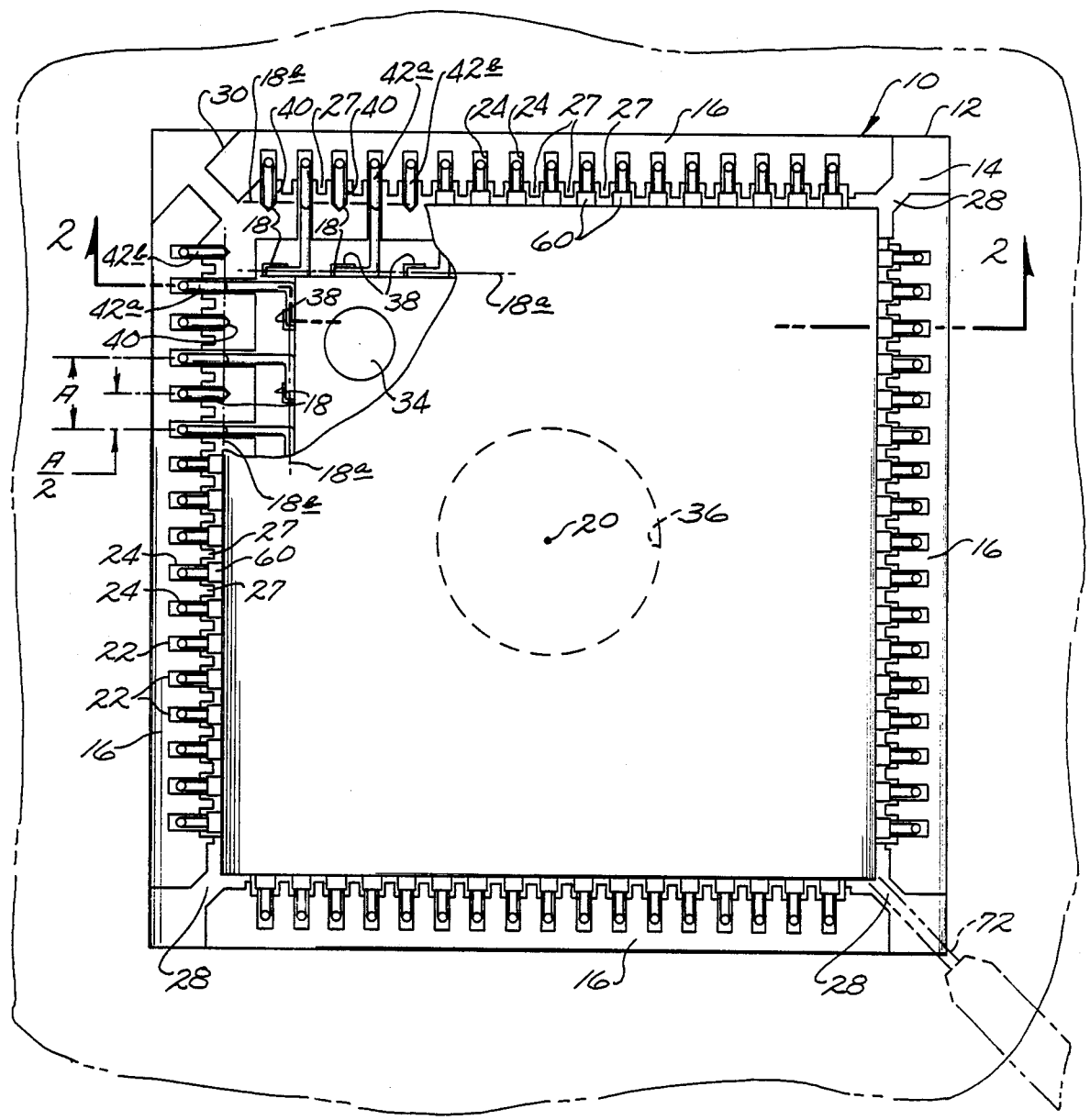
FIG. 1 is a plan view of the novel and improved connector of this invention, the connector being illustrated with a chip carrier unit mounted therein, with the chip carrier partly but away, and with some of the connector contacts removed for clarity of illustration.
Figure 2:
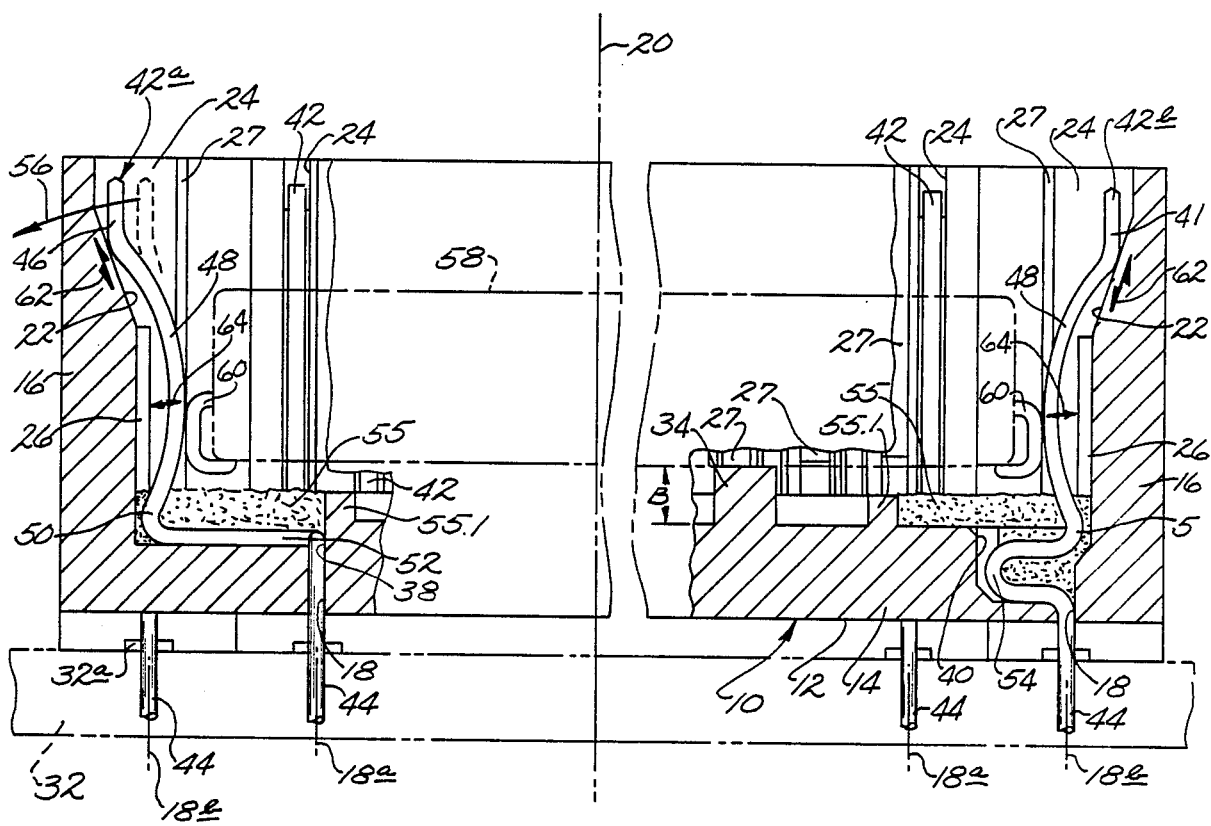
FIG. 2 is a section view to enlarge scale, partially cut away, along line 2—2 of FIG. 1.

Referring to the drawings, 10 in FIGS. 1 and 2 indicates the novel and improved chip carrier socket or connector of this invention which is shown to comprise a body 12 of strong, stiff, electrically insulating material such as a glass-filled nylon or a high crystallinity polyethylene or other similar material. The connector body is formed by molding or the like to have a bottom 14, side walls 16 upstanding from the bottom, and a plurality of openings 18 in the bottom spaced around a common axis 20. Preferably the openings 18 are arranged in a pair of inner and outer rows 18a, 18b extending along the body side walls with a selected spacing A between the openings in each row. The side walls preferably have ramp surfaces 22 which face the common axis 20 and which are inclined relative to that common axis to face away from the bottom of the body. Preferably the ramp surfaces 22 are provided within guide slots 24 which are formed in the side walls with half said selected spacings A between the guide slots as is indicated at A/2 in FIG. 1. Preferably lower portions of the guide slots have V-shaped surface portions as indicated at 26 in FIGS. 1 and 2.

In a preferred embodiment of the connector 10, the side walls 16 have spaces 28 between the ends of the side walls; polarizing means such as flattened surfaces 30 are preferably provided on the ends of some of the side walls to facilitate orienting of the connector 10 on a printed circuit board diagrammatically indicated at 32 in FIGS. 1 and 2; and spacers 34 preferably extend to a selected height B above the bottom of the body for a purpose to be described below. If desired, a weight-reducing aperture 36 is left at the center of the connector body. In a preferred embodiment, first orientation slots 38 having a first disposition relative to openings 18 are arranged to communicate with openings in the inner row 18a while second orientation slots 40 having a second disposition relative to openings 18 are arranged to communicate with openings in the outer row 18b.

In accordance with this invention, a plurality of contacts 42 of resilient, electrically conductive metal material such as phospor bronze or beryllium copper or the like are disposed in the respective body openings 18. Preferably each contact is formed from a wire material of substantially round cross section and has one end 44 disposed in a body opening 18 so that a post portion of the contact end extends from the bottom of the body with the selected spacing A between the adjacent contact ends, thereby to fit into corresponding openings in the printed circuit board 32 and to be soldered or otherwise electrically connected on that p.c. board as is diagrammatically indicated at 32a in FIG. 2. Each contact also has an opposite end 46, preferably bent into a slide configuration, to be slidably engaged with a respective adjacent side wall ramp surface 22 in a side wall guide slot 24. Each contact also has a bowed portion 48 intermediate the contact ends which is bowed away from the adjacent side wall ramp surface 22. Preferably each contact has an additional portion 50 located between the bowed contact portion and said one contact end 44 which is slidably engaged with an adjacent side wall surface, preferably with the V-shaped surface 26 in the lower portion of the side wall guide slot.

In a preferred embodiment of the invention, each contact 42 in a first group of contacts disposed in the openings in the inner row 18a has an orientation loop or bight portion 52 bent or otherwise formed therein with a first disposition relative to the openings to be received in respective orientation slots 38 in the connector body while each contact 42 in a second group of contacts disposed in the openings in the outer row 18b has an orientation loop or bight portion 54 formed therein with a second disposition relative to the openings to be received in respective orientation slots 40 in the connector body, thereby to dispose opposite ends of the first group of contacts to slidably engage ramps surfaces in respective alternate ones of the side wall guide slots, to dispose opposite ends of the second group of contacts to slidably engage ramp surfaces in respective other ones of the side wall guide slots, to dispose the additional portions 50 of each of the contacts to be slidable on surfaces of the V-shaped grooves 26 to be centered in the V-shaped surfaces 26 in the guide slots, and to dispose the bowed portions of all of the contacts with a selected orientation relative to the common axis 20. That is, the orientation portions 52 in the first group of contacts each have an angle portion bent therein to lie in the plane of the bottom of the connector body and the orientation slots 38 have a corresponding angle shape and receive the contact orientation portions 52 therein so that the bowed portions 48 of the first group of contacts are disposed in planes normal to the ramp surfaces on the adjacent body side walls. The orientation portions 54 of the second group of contacts are preferably formed in the plane of the bowed portions 48 of the contacts in the second group and the orientation slots 40 are aligned to fall into the planes of the respective side wall guide slots 24 so that when the orientation loops are fitted into the orientation slots the bowed portions 48 of the contacts in the second group along each side wall 16 are diposed in parallel planes which extend normal or perpendicular to the side walls. Preferably an epoxy adhesive or the like is introduced into the openings 18 and orientation slots 52, 54 as indicated at 55 for securing the contacts 42 in their desired orientation in the body openings. Preferably that adhesive means also serves to seal the openings for excluding solder, solder flux or other extraneous materials from the connector during use. If desired a ridge 55.1 in the body defines a well for receiving and positioning the epoxy adhesive.

In that arrangement, each contact 42 is mounted to permit both cantilever beam spring and simple beam spring deflection of the contact as indicated by the arrows 56 and 64 in FIG. 2 when a chip carrier unit is inserted into the connector along the common axis 20 as indicated by the broken lines 58. That is, where the chip carrier unit has short, stiffly resilient terminals or leads 60 of a J configuration, the terminals are adapted to slidably engage the bowed portions 48 of the contacts for deflecting the contacts outwardly from the common axis 20 with a cantilever spring deflection as indicated by arrow 56 to assure that each contact 42 is in resilient electrical engagement with an intended unit terminal 60. During that cantilever movement, the bowed portion of the contacts tend to pivot around the centered engagement of the additional contact portions 50 with the side walls against the V-shaped guide slot surfaces for achieving further uniformity of contact engaging force.

That cantilever spring deflection engages the opposite ends 46 of the contacts with respective adjacent side wall ramp surfaces 22. That engagement of the chip carrier unit terminals with the contact bowed portions also serves to slide the opposite contact ends along the ramp surfaces as indicated by arrows 62 and permits selected flattening of the contact bowed portions as indicated by the arrows 64 for providing simple beam spring deflection of the contacts as well. That is, the bent opposite ends of the round contact wires tend to have a point-like engagement with the ramp surfaces but easily slide along narrow lines of engagement with the ramp surfaces as guided by the guide slots 24. The spacing of the ramp surfaces 22 from each other on opposite sides of the connector body are easily controlled during molding of the body. Further, the lengths of the contact bowed portions 48 increase as the bows are flattened to provide a resilient contact engaging force between the contacts 42 and their mating chip carrier unit terminals 60.

In accordance with this invention, the configuration and proportions of the contacts 42 are selected relative to the connector body for providing improved accommodating of the chip carrier unit 58 between the contacts 42 while also providing more uniform and more positively predetermined contact force between the contacts 42 and their respective mating terminals on the chip carrier unit. The use of a round cross section wire material in the contacts achieves full utilization of the spring material in the wires and provides uniformity of contact engagement with the side wall ramp surfaces. In that way, the connector of this invention mounts chip carrier units having large numbers of terminals with greater ease and reliability while also achieving improved unit terminal density. For example, the proportions of the contacts 42 are selected so that the force per unit deflection for the simple beam spring deflection of the contacts is substantially greater than force per unit deflection for the cantilever spring deflection of the contacts. The diameter or cross section of the contact wire material as well as its length and stiffness are selected relative to the configuration and length of the contact bowed portion 48 so that such force per unit deflection for the simple beam spring deflection on the contacts tends to be on the order of at least five times greater than the force per unit deflection for the noted cantilever type of spring deflection for the individual contacts. The inclination of the ramps surfaces 22 relative to the axis 20 is selected so that the force per unit deflection for simple beam spring deflection of the contacts as mounted in the connector body is on the order of ten times the force per unit deflection for the cantilever spring movement of the contacts when engaged by chip carrier unit terminal. In that way the spacing of the openings 18 from the adjacent body side walls and the location and inclination of the side wall ramps surfaces 22 are adapted to be precisely controlled. Forming of the ramp surfaces within the guide slots also provides for maintaining the desired inclination of those ramp surfaces against possible warping. Further, the bowed contact portions are easily formed with precision to provide the bowed contact portions with properly predetermined spring characteristics. The mounting of the contacts permitting cantilever spring deflection of the contacts permits the contacts to easily accommodate the chip carrier unit within the connector while still providing precisely predetermined contact forces engaging the chip carrier terminals.

For example, where the chip carrier unit has 68 contacts and is of minimum size within the tolerance specified by an industry standard using contacts 42 embodying 0.012 inch diameter CDA Alloy 510 materials, the contacts provide a normal force per contact of 350 grams and a total insertion/withdrawal force of 14 pound whereas where the chip carrier unit is at the maximum size permitted by the industry standard, the price per contact in the device of this invention is no more than about 850 grams per contact for an insertion/withdrawal force of about 30 pounds.

In accordance with this invention, the bowed portion 48 of the contacts are also selected relative to the height B of the spacers 34 on the bottom of the connector body for detachably retaining the chip carrier unit 58 within the connector 10. That is, the configuration of the bowed contact portions are preferably arranged so that, when engaged with chip carrier unit terminals, the contact bowed portions each have an upper part 66 facing the common axis which is inclined to face away from the bottom of the body, have a central part 68 with a selected minimum spacing from the common axis 20, and have a lower part 70 which is inclined relative to the axis 20 to face toward the bottom of the connector body. The spacers 34 are proportioned to engage the chip carrier unit to limit insertion of the unit into the connector such that the chip carrier terminals engage the contact bowed portions at or just below the central parts 68 of the contact bowed portions so that engagement of the contacts with the terminals detachably retains the unit in the connector but permits withdrawal of the unit from the connector with a limited withdrawal force.

It should be understood that although particular embodiments of this invention have been described by way of illustrating the invention, the invention includes all modifications and equivalents of the disclosed embodiments falling within the scope of the appended claims.

We claim:

1. A connector for mounting a chip carrier unit in an electronic circuit comprising an electrically insulating body having a bottom, side walls upstanding from the bottom, and a plurality of openings spaced in the bottom around a common axis. and a plurality of resilient, electrically conductive contacts disposed in respective body openings to resiliently engage terminal means on opposite sides of a chip carrier unit inserted into the connector along the common axis, the connector body having ramp surfaces on the side walls facing the common axis and inclined relative to the common axis to face away from the bottom of the body, characterized in that the body side walls have a plurality of guide slot portions of V-shaped cross section therein in selected locations relative to respective body openings, and in that the contacts comprise wire members of substantially round cross section each having one end secured in a respective body opening to permit relatively low force cantilever spring deflection of the contacts for accommodating the chip carrier unit therebetween, each contact having a bent portion of the round wire cross section at an opposite end slidable along a narrow line of engagement with an adjacent side wall ramp surface extending along the direction of incline in the ramp surface, having a bowed portion of the round wire cross section intermediate the contact ends bowed away from the adjacent side wall ramp surface to slidably engage the terminal means on the chip carrier unit along a narrow line of engagement extending in the direction of insertion of the chip carrier unit into the connector to permit selected flattening of the bowed contact portion and said sliding of the opposite contact end on the adjacent side wall ramp surface for providing simple beam spring deflection of the contact with relatively much greater force to resiliently engage the terminal means with more precisely predetermined contact forces, and each contact having an additional portion of the round wire cross section location between the contact bowed portion and said one contact end disposed in centered engagement with the body side wall within a respective guide slot portion of V-shaped cross section to guide and facilitate pivoting of the bowed contact portion relative to said centered engagement.

2. A connector according to claim 1 further characterized in that the contacts and diameters of the round wires in the contacts are proportioned relative to the inclination of the said side wall ramp surfaces to require at least ten times greater force per unit deflection for said simple beam spring deflection than for said cantilever spring deflection.

3. A connector according to claim 2 further characterized in that the bottom of the body has orientation slots therein having selected dispositions relative to the respective body openings, and the contacts have other, round wire, portions thereof located intermediate said additional portions and said one contact ends accommodated in respective orientation slots for arranging round wire cross section bowed portions of the contacts with predetermined orientations relative to said common axis and to said adjacent side wall ramp surfaces, at least some of said contact orientation portions being of loop configuration.

4. A connector according to claim 3 further characterized in that adhesive means secure said contact orientation portions in said body orientation slots and seal said body openings.

5. A connector according to claim 4 further characterized in that said body openings are arranged in a pair of inner and outer rows extending along the body side walls with a selected spacing between the openings in each row, said side wall slots are arranged with half said selected spacing therebetween, contacts in a first group thereof have said one contact end secured in respective body openings in said inner contact row to extend from the body through said opening, have orientation portions thereof angularly disposed in the plane of the body bottom and have said opposite contact ends slidable on ramp surfaces in respective alternate side wall slots, offset from the respective body openings, and the contacts in a second group thereof have said one contact ends secured in respective body openings in said outer contact row to extend from the body through said openings, have loop shaped orientation portions thereof disposed in the plane of the respective bowed contact portions and have said opposite contact ends slidable on ramp surfaces in respective other side wall slots, the connector body having said orientation slots disposed to receive said angularly disposed and loop-shaped orientation portions of the contacts freely therein, thereby providing said one contact ends with said selected spacing extending from the body to be connected in an electrical circuit while permitting the contacts to engage terminal means on the chip carrier unit with half said selected spacing.

* * * * *